United States Patent
Ahn et al.

(10) Patent No.: US 9,683,711 B2
(45) Date of Patent: Jun. 20, 2017

(54) LIGHT EMITTING DEVICE SUBSTRATE AND METHOD FOR MANUFACTURING THE SAME

(71) Applicant: Point Engineering Co., Ltd., Asan-si, Chungcheongnam-do (KR)

(72) Inventors: Bum Mo Ahn, Yongin-si (KR); Seung Ho Park, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 242 days.

(21) Appl. No.: 14/513,601

(22) Filed: Oct. 14, 2014

(65) Prior Publication Data

US 2015/0103541 A1    Apr. 16, 2015

(30) Foreign Application Priority Data

Oct. 15, 2013  (KR) ........................ 10-2013-0122414

(51) Int. Cl.
*F21V 19/00*    (2006.01)
*F21V 21/00*    (2006.01)
(Continued)

(52) U.S. Cl.
CPC ............ *F21K 9/90* (2013.01); *H01L 25/0753* (2013.01); *F21Y 2101/00* (2013.01);
(Continued)

(58) Field of Classification Search
CPC ....... F21K 9/90; H01L 25/0753; H01L 33/62; H01L 2224/48; H01L 2924/0002;
(Continued)

(56) References Cited

U.S. PATENT DOCUMENTS

| 2010/0207142 A1* | 8/2010 | Chen ................... H01L 25/0753 257/98 |
| 2011/0001420 A1* | 1/2011 | Tchakarov .......... H01L 51/5212 313/355 |

(Continued)

FOREIGN PATENT DOCUMENTS

KR   WO 2011122846 A2 *  10/2011   ......... H01L 25/0753

*Primary Examiner* — Andrew Coughlin
*Assistant Examiner* — Glenn Zimmerman
(74) *Attorney, Agent, or Firm* — Sunstein Kann Murphy & Timbers LLP

(57) ABSTRACT

The present invention relates to an optical device substrate comprising: unit block substrates wherein a flat panel metal substrate are partitioned into n (n>1) number of optical device attachment areas, and the insulating members are formed inside the metal substrate in a way that the adjacent partitioned areas are insulated; first horizontal insulating members for insulating between the unit block substrates being stacked; outer metal electrode substrates bonded to the unit block substrates located in the upper end and the lower end among the unit block substrates being stacked; second horizontal insulating members for insulating between the outer metal electrode substrates and the unit block substrates; a pair of inner metal electrode substrates inserted instead of the first horizontal insulating members into more than any one of the adjacent unit block substrates; and third horizontal insulating members for insulating the pair of inner metal electrode substrates.

5 Claims, 12 Drawing Sheets

(51) Int. Cl.
*F21K 9/90* (2016.01)
*H01L 25/075* (2006.01)
*H01L 33/62* (2010.01)
*F21Y 101/00* (2016.01)
*F21Y 115/10* (2016.01)

(52) U.S. Cl.
CPC ........... *F21Y 2115/10* (2016.08); *H01L 33/62* (2013.01); *H01L 2224/48* (2013.01); *H01L 2924/0002* (2013.01); *H01L 2933/0066* (2013.01); *Y10T 29/49126* (2015.01)

(58) Field of Classification Search
CPC ....... H01L 2933/0066; Y10T 29/49126; F21Y 2101/00
USPC .............................. 362/382; 257/88, 98, 100
See application file for complete search history.

(56) References Cited

U.S. PATENT DOCUMENTS

| | | | |
|---|---|---|---|
| 2013/0037833 A1* | 2/2013 | Nam | H01L 25/0753 257/88 |
| 2013/0228804 A1* | 9/2013 | Yan | H01L 33/48 257/88 |

* cited by examiner

LIGHT EMITTING DEVICE SUBSTRATE AND METHOD FOR MANUFACTURING THE SAME

BACKGROUND

1. Technical Field

The present invention relates to an optical device, and more particularly, to a method of manufacturing an optical device substrate in which an optical device can be arranged variously, and an optical device substrate capable of being manufactured by the same.

2. Description of the Related Art

Application field of an optical device such as a light emitting diode (LED) and the like which is a next generation lighting source, is gradually being expanded. Especially, an LED is a kind of semiconductor device converting electrical energy into light energy using characteristics of a semiconductor comprising a specific compound, and since its light conversion efficiency is high, unlike the conventional lighting devices such as an incandescent bulb, a fluorescent lamp, and the like, the energy consumption can be reduced as much as 90%. Further, it is advantageous in that LEDs are compact light sources, and thus are suitable for miniaturization and weight reduction, enable limitless expanded installation, and have a very long semi-permanent lifespan.

Due to the advantages and features described above, LEDs are expected to be widely used in various fields. Accordingly, a new type of optical device substrate on which optical devices or optical device chips can be variously arranged in accordance with the service environment and the apparatus in use, is needed.

SUMMARY

Thus, the present invention, which is devised according to the foregoing necessity, provides a new type of optical device substrate on which optical devices or optical device chips can be variously arranged and designed.

Also, the present invention provides a method for manufacturing an optical device substrate wherein a plurality of channel optical circuits, which can be operated by using different power supplies within the independent substrates, can be constructed.

Another objective of the present invention is to provide a method for manufacturing an optical device substrate which can provide an optical device substrate having an excellent mechanical strength by fabricating a substrate having a structure, wherein an area for attaching an optical device, i.e. an optical device attachment area, may be oriented not only in horizontal direction but also in vertical direction.

Moreover, the present invention is to provide an optical device substrate which can be manufactured by these methods.

To achieve above described objective, a method for manufacturing an optical device substrate according to an embodiment of the present invention provides a method of manufacturing an optical device substrate, including:

manufacturing a plurality of unit block substrates by stacking n (n>1) number of flat panel metal substrates and cutting a first metal substrate-bonded body made by forming insulating members between stacked surfaces of the flat panel metal substrates such that each unit block substrate is partitioned into n number of optical device attachment areas by (n−1) number of the insulating members;

manufacturing a second metal substrate-bonded body by stacking at least m (m>1) number of the unit block substrates in a manner that the insulating members are oriented in a vertical direction, inserting at least one of the insulating members and metal electrode substrates between the stacked surfaces, and bonding the metal electrode substrates onto a top and a bottom of the second metal substrate-bonded body; and manufacturing the optical device substrate by cutting the second metal substrate-bonded body from the top to the bottom such that each cut surface has m×n number of the optical device attachment areas.

The method of manufacturing the optical device substrate may further include:

forming a cavity having a predetermined depth in the optical device substrate, an upper portion of the cavity being wider than a lower portion of the cavity so that every optical device attachment area is accommodatable at a bottom surface of the cavity;

bonding an optical device into at least a portion of the optical device attachment areas of the optical device substrate in which the cavity is formed, and electrically connecting the optical device attachment area or the metal electrode substrate adjacent to the optical device using a wire; and forming a protective layer above the optical device.

According to another embodiment of the present invention, the method of manufacturing the optical device substrate of the above is characterized in that the second metal substrate-bonded body is manufactured in a manner that the metal electrode substrates and the insulating members are sequentially formed between adjacent ones of the unit block substrates of the second metal substrate-bonded body, wherein the metal electrode substrate formed between adjacent ones of the unit block substrates of the second metal substrate-bonded body has a greater thickness than those of the metal electrode substrates bonded to the top and the bottom of the second metal substrate-bonded body.

Further, according to another embodiment of the present invention, there is provided an optical device substrate including:

unit block substrates accommodating therein (n−1) number of insulating members for insulating adjacent partitioned areas of a flat panel metal substrate, the insulating members partitioning the flat panel metal substrate into n (n>1) number of optical device attachment areas;

first horizontal insulators for insulating surfaces of each unit block substrate in a horizontal direction, wherein at least m (m>1) number of the insulating members formed in each unit block substrate are oriented in a vertical direction, wherein the optical device substrate has m×n number of optical device attachment areas;

metal electrode substrates for supplying power by being bonded to a top and a bottom of a second metal substrate-bonded body formed by stacking the unit block substrates; and second horizontal insulators for insulating the metal electrode substrates and the unit block substrates adjacent thereto.

According to the embodiments of the present invention, the method of manufacturing an optical device substrate can provide excellent mechanical strength since the optical device attachment areas are arranged in a horizontal direction and a vertical direction.

Further, since the optical device attachment areas are arranged in the horizontal and vertical directions, the optical devices or the optical device chips can be variously arranged on the substrate according to a service environment and an application apparatus.

Moreover, since manufacturing can be performed by inserting the metal substrates for a plurality of metal substrates of electrodes in the inner side of the optical device substrate according to the present invention, independent channels can be formed by grouping the plurality of optical elements by the metal electrode substrates, and since independent power for each channel is able to be supplied, each channel can be independently controlled by constructing optical element circuits of the plurality of channels according to a service environment and a use.

DETAILED DESCRIPTION OF EMBODIMENTS

Hereinafter, a method of manufacturing an optical device substrate according to an embodiment of the present invention will be described in detail with reference to the accompanying drawings.

Figure 1:
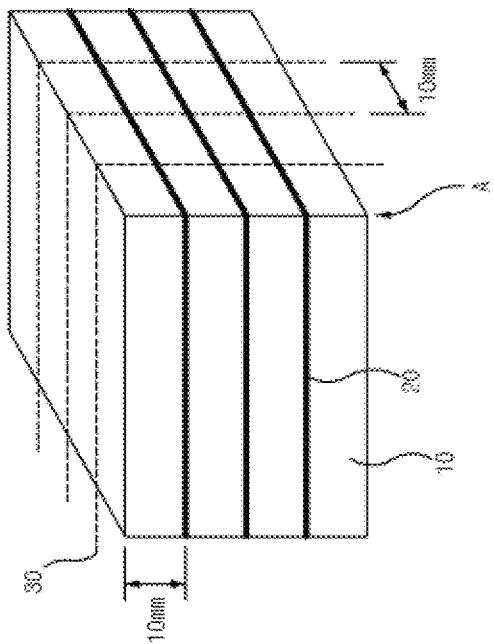
FIG. 1 is a diagram for describing a step of manufacturing a first metal substrate-bonded body in a method of manufacturing an optical device substrate according to an embodiment of the present invention.
Figure 2A:
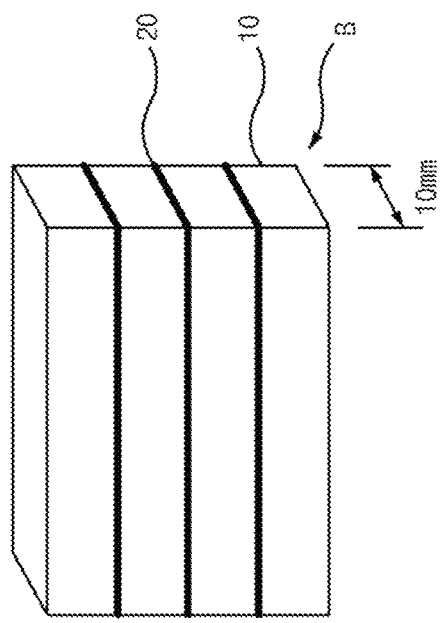
FIGS. 2a and 2b are diagrams for describing a step of manufacturing a unit block substrate in a method of manufacturing an optical device substrate according to an embodiment of the present invention.
Figure 2B:
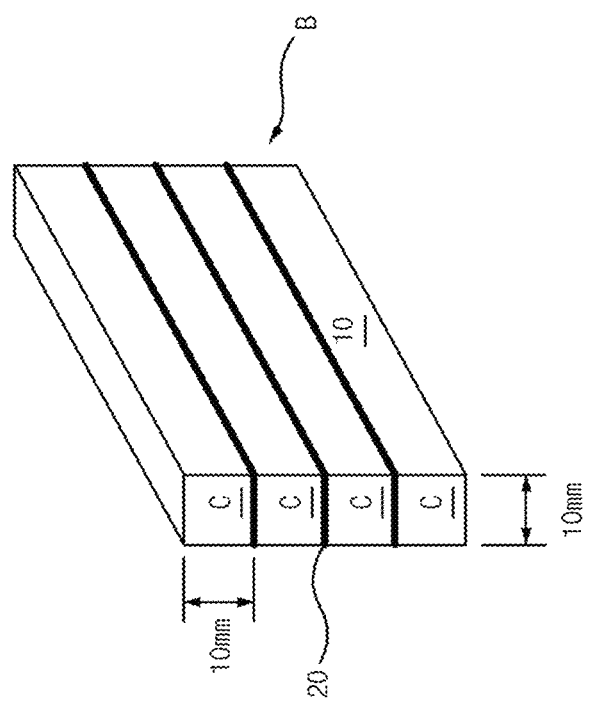

FIG. 1 is a diagram for describing a step of manufacturing a first metal substrate-bonded body in a method of manufacturing an optical device substrate according to an embodiment of the present invention, and FIGS. 2a and 2b is a diagram for describing a step of manufacturing a unit block substrate in a method of manufacturing an optical device substrate according to an embodiment of the present invention.

First, in order to manufacture an optical device substrate according to an embodiment of the present invention, as shown in FIG. 1, four flat panel type metal substrates 10 having a uniform thickness (for example, 10 mm) may be stacked, and a first metal substrate-bonded body may be formed by forming insulating members 20 between the four flat panel type metal substrates 10. For reference, the flat panel type metal substrates 10 may be metal substrates having excellent heat transfer characteristics and electrical conductivity. As a typical example, an aluminum metal substrate or a metal substrate made of an aluminum alloy may be used. The insulating members 20 may electrically insulate the four stacked flat panel type metal substrates 10, and be formed by anodizing surfaces of the flat panel type metal substrates 10 of a material such as an aluminum, and on the other hand, be formed by bonding insulating films of a synthetic resin material.

As described above, when a first metal substrate-bonded body A shown in FIG. 1 is formed by sequentially stacking the flat panel type metal substrate 10 and the insulating member 20, the first metal substrate-bonded body A may be cut (wire sawing) along cutting lines represented as reference numeral 30. As shown in FIGS. 2a and 2b, a plurality of unit block substrates B having the uniform thickness 10 mm may be formed, and each unit block substrate B may be partitioned into four optical device attachment areas C as shown in FIGS. 2A and 2B by three insulating members 20 stacked in FIG. 1.

Figure 3:
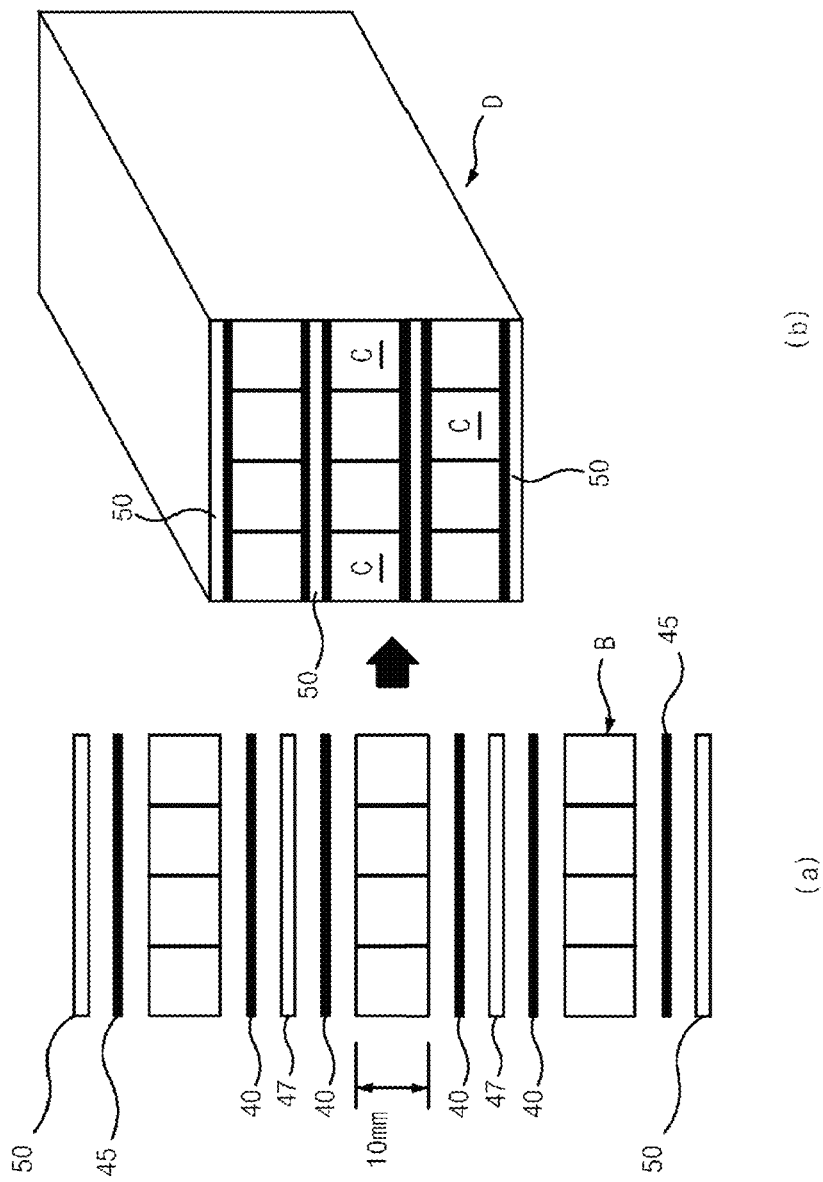
FIG. 3 is a diagram for describing a step of manufacturing a second metal substrate-bonded body in a method of manufacturing an optical device substrate according to an embodiment of the present invention.

Meanwhile, FIG. 3 is a diagram for describing a step of manufacturing a second metal substrate-bonded body in a method of manufacturing an optical device substrate according to an embodiment of the present invention.

A second metal substrate-bonded body D may include at least m or more (m>1) unit block substrates B (3 unit block substrates in FIG. 3) which are stacked as shown in (a), and when one, two or more of the first insulating member 40 such as an adhesive film and an inner metal electrode substrate 47 between the stacked unit block substrates are bonded, the second metal substrate-bonded body D may be formed as shown in (b), and the second metal substrate-bonded body D may be manufactured by bonding the outer metal electrode substrate 50 to the top and bottom of the second metal substrate-bonded body D. The outer metal electrode substrates 50 which are located at the top and bottom of the second metal substrate-bonded body D may be used for forming terminals for providing power. The inner metal electrode substrates 47 which are located inside the second metal substrate-bonded body D may be used as a coupling medium for providing independent power by grouping the plurality of optical device attachment areas into a separate channel or for electrically connecting adjacent unit block substrates B.

As described above, when the second metal substrate-bonded body D is manufactured by a method of stacking at least m or more (m>1) unit block substrates B and bonding one, two or more of the first insulating member 40 and the inner metal electrode substrate 47 between the stacked unit block substrates B, the m×n number of the optical device attachment areas C may be defined in the second metal substrate-bonded body D. In FIG. 3, an example in which the first insulating member 40, the inner metal electrode substrate 47 and the first insulating member 40 are sequentially formed between adjacent unit block substrates B in order to construct the second metal substrate-bonded body D is illustrated. However, this is only an example, and the unit block substrate B, the first insulating member 40, the first insulating member 40, and the unit block substrate B may be sequentially formed according to necessity. Further, the unit block substrate B, the first insulating member 40, the inner metal electrode substrate 47, the inner metal electrode substrate 47, the first insulating member 40, and the unit block substrate B may be sequentially formed. Moreover, the inner metal electrode substrate 47 which is formed between the adjacent unit block substrates B constructing the second metal substrate-bonded body D may have a greater thickness than the outer metal electrode substrate 50 bonded to the top and bottom of the second metal substrate-bonded body D. This may be for the purpose of manufacturing another optical device substrate by cutting the inner metal electrode substrates 47 (shown in FIG. 8) which are located on an inner side and have a greater thickness. For reference, an aluminum sheet may be used as the outer metal electrode substrate 50. Since the outer metal electrode substrate 50 is used for connecting the electrode, it needs not to be thick.

Figure 4:
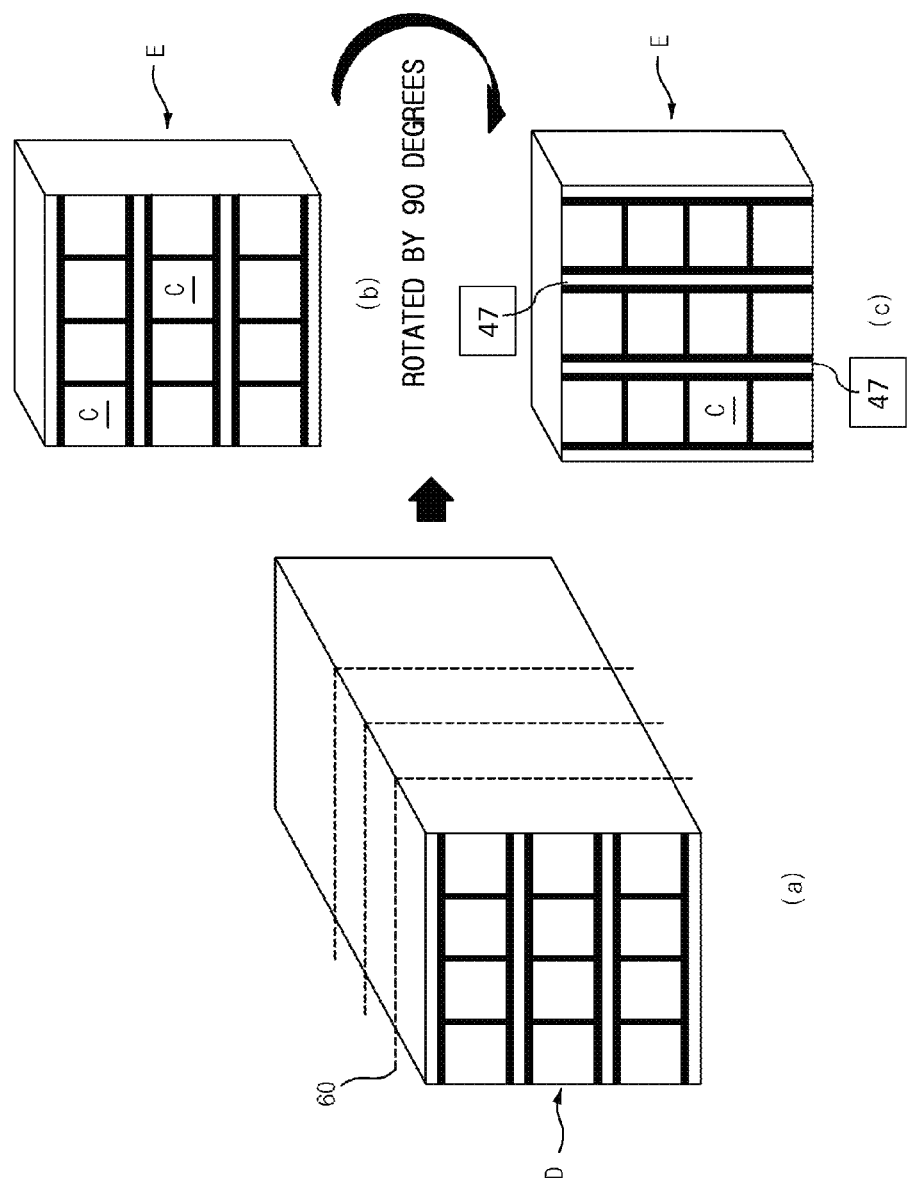
FIG. 4 is a diagram for describing a step of manufacturing an optical device substrate in a method of manufacturing an optical device substrate according to an embodiment of the present invention.

Meanwhile, FIG. 4 is a diagram for describing a step of manufacturing an optical device substrate E in a method of manufacturing an optical device substrate according to an embodiment of the present invention.

Referring to FIG. 4, first, when the second metal substrate-bonded body D is formed as shown in FIG. 3, the second metal substrate-bonded body D may be cut along cutting lines represented by reference numeral 60 shown in (a) of FIG. 4. As shown in (b) of FIG. 4, each optical device substrate E having m×n optical device attachment areas C (3×4 in FIG. 4) may be formed as shown in (b) of FIG. 4. Referring to (b) and (c) of FIG. 4, the optical device substrate E according to an embodiment of the present invention may have a structure in which the optical device attachment areas C are arranged in the horizontal and vertical directions. Since the inner metal electrode substrate 47 having the aluminum material is located between the substrates, the optical device attachment areas C may have excellent mechanical strength.

Hereinafter, postprocessing for bonding an optical device 70 on the optical device substrate E manufactured by the above-described operations, and electrically connecting the optical device and the inner and outer metal electrode substrates 47 and 50 which are bonded on the substrate using a wire 80 will be described.

Figure 5A:
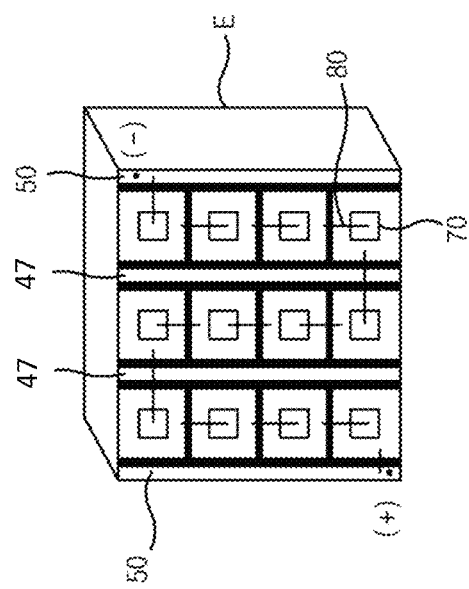
FIGS. 5a to 5c are diagrams for describing a step of bonding an optical device and connecting a wire, and an optical device connection structure in a method of manufacturing an optical device substrate according to an embodiment of the present invention.
Figure 5B:
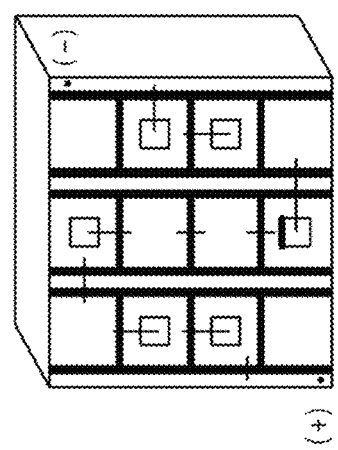
Figure 5C:
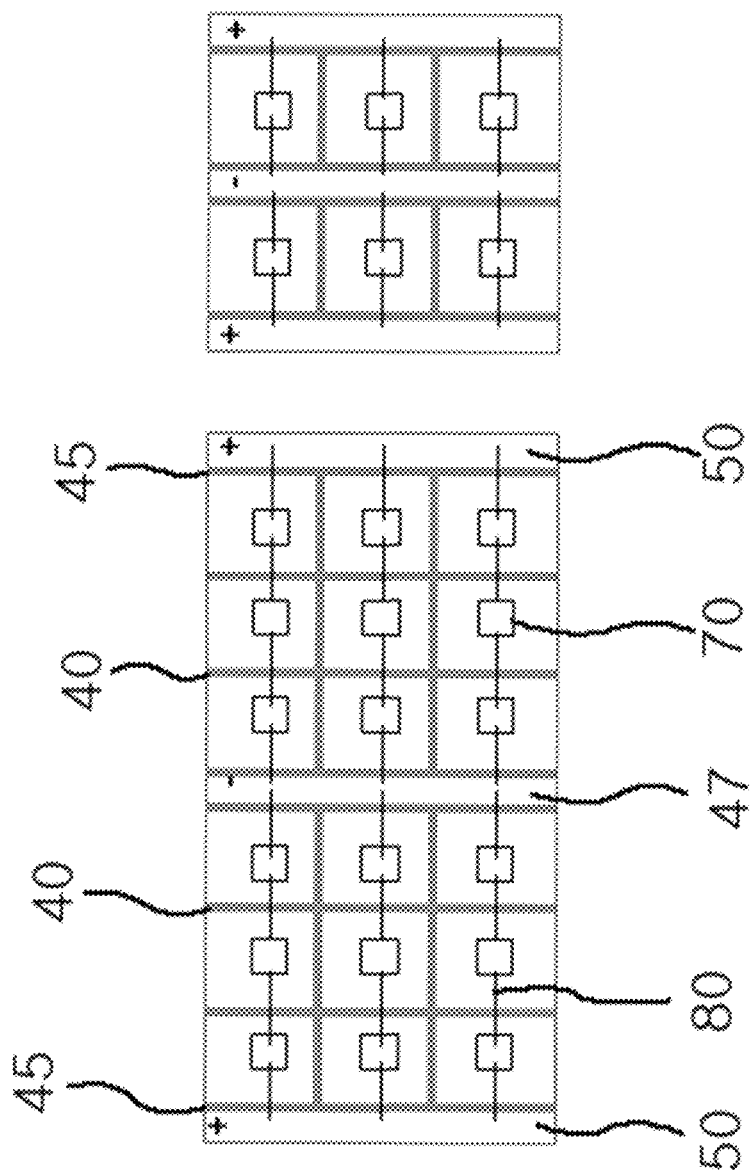

FIGS. 5*a* to 5*c* are diagrams for describing a step of bonding an optical device 70 and connecting a wire 80, and an optical device connection structure in a method of manufacturing an optical device substrate according to an embodiment of the present invention.

As shown in FIGS. 5*a* and 5*b*, for example, a substrate may be manufactured by selectively bonding an optical device 70 in each of 3×4 optical device attachment areas C as shown in FIGS. 5*a* and 5*b*. A conductive adhesive may be used for the method of bonding the optical device as is already known. The conductive adhesive may be formed by one selected from a eutectic melting point solder, a high melting point solder, a lead-free solder, and a silver (Ag) paste, but is not limited thereto. In this embodiment, one electrode of each optical device is bonded in each optical device attachment area C.

Further, one end of the conductive wire 80 may be bonded to the optical device 70 by ball bonding as shown in FIGS. 5*a* and 5*b*, and the other end of the conductive wire 80 may be bonded to an adjacent optical device attachment area C or an adjacent outer metal electrode substrate 50 by stitch bonding according to necessity, and vice versa. In an embodiment of FIGS. 5*a* and 5*b*, a power source is connected to only the outer metal electrode substrates 50 which are located on the left and right. In such a structure, the optical devices 70 which are arranged on the substrate may construct one serial circuit. Further, FIG. 5*b* shows that the optical device 70 is not bonded in every optical device attachment area C and is located in only a desired optical device attachment area, and one serial circuit is constituted by also electrically connecting the optical device attachment areas C in which the optical device 70 is not bonded through the wire 80 in order to provide an electrical path. For reference, FIG. 5*c* illustrates a structure in which the optical devices are connected in series and in parallel according to necessity.

Accordingly, when the optical device substrate of the present invention is used, an optical device or an optical device chip arrangement of a desired type may be designed.

Further, an optical device substrate according to another element of the present invention may form an electrical circuit by bonding the optical device and the wire after forming a cavity. This will be further described with reference to FIGS. 6 and 7.

Figure 6:
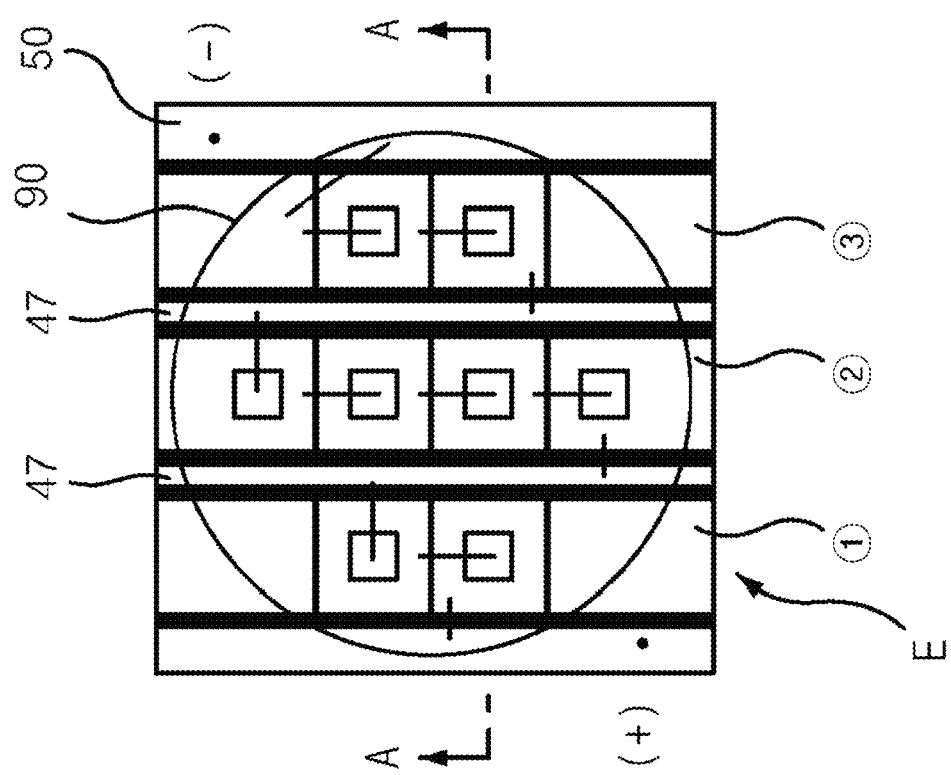
FIGS. 6 and 7 are diagrams for describing a step of forming a cavity in a method of manufacturing an optical device substrate according to an embodiment of the present invention.
Figure 7:
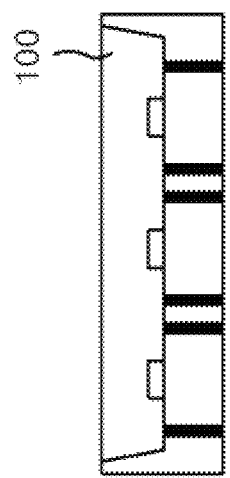

First, FIGS. 6 and 7 are diagrams for describing a step of forming a cavity in a method of manufacturing an optical device substrate according to an embodiment of the present invention.

A cavity 90 formed in the optical device substrate may be formed by designating the optical device attachment area C for accommodating the optical device in the bottom surface of the cavity 90. That is, in FIG. 6, the cavity 90 having a predetermined depth in the optical device substrate E and a shape of a wide upper portion and a narrow lower portion may be formed so that every optical device attachment area C which is on the substrate is accommodated in the bottom surface of the cavity 90. Since the method of forming the cavity through a mechanical process is also known in this technical field, detailed description will be omitted.

When the cavity 90 is formed, as described above, the optical device 70 may be bonded all or a portion of the optical device attachment area C of the optical device substrate E in which the cavity 90 is formed, and the optical device 70 and an adjacent optical device attachment area C or the adjacent inner or outer metal electrode substr, 47 or 50, may be electrically connected using the wire 80. As is well known, another type of optical device substrate may be manufactured by forming a protective layer 100 above the optical devices 70 as shown in FIG. 7. For reference, the inner metal electrode substrates 47 which are located on the inner side may be omitted from the substrate shown in FIG. 6. In this case, an electrical path may have to be formed by connecting the wire from a substrate ① to a substrate ②, and also by connecting the wire from the substrate ② to a substrate ③.

Figure 8:
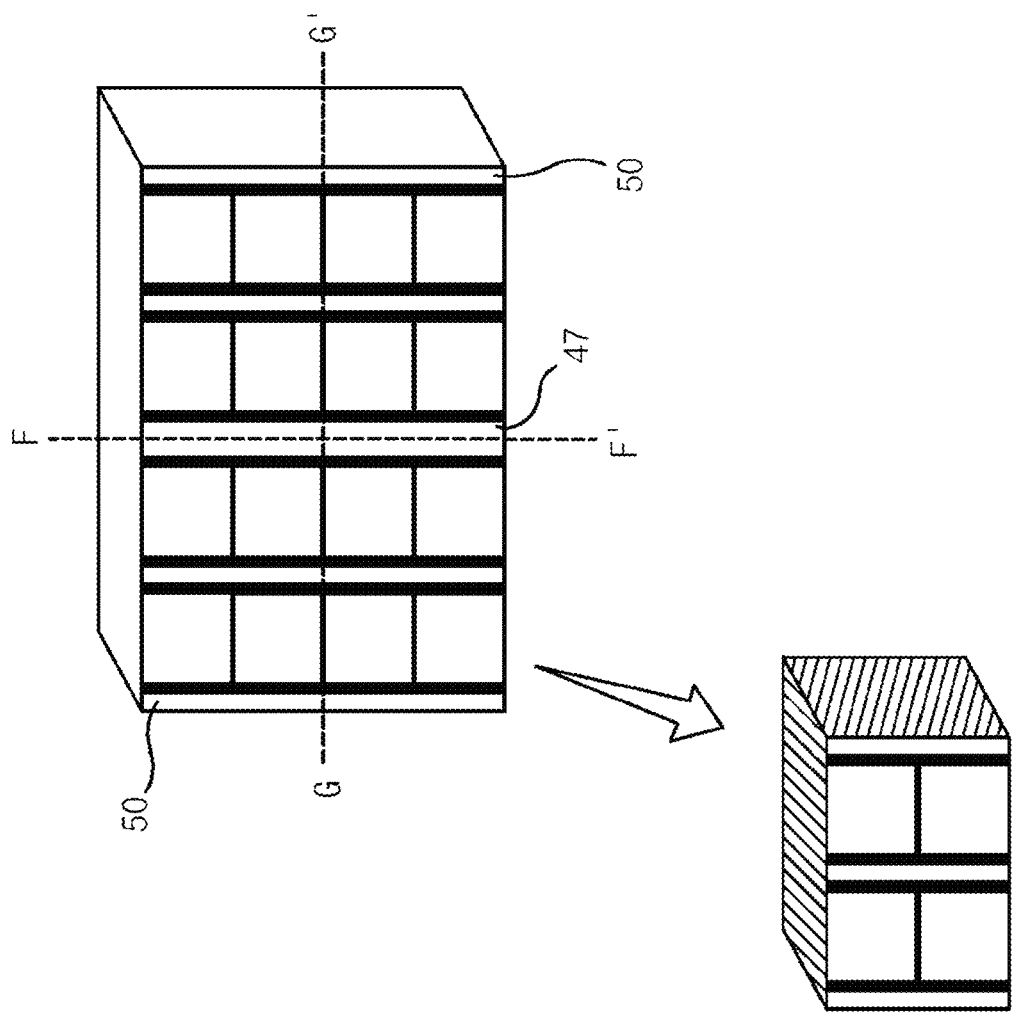
FIG. 8 is a diagram for additionally describing a step of separating an optical device substrate into a plurality of substrates in a method of manufacturing an optical device substrate according to an embodiment of the present invention.

FIG. 8 is a diagram for additionally describing a step of separating an optical device substrate into a plurality of substrates in a method of manufacturing an optical device substrate according to an embodiment of the present invention.

Referring to FIG. 8, the inner metal electrode substrates 47 which are located on the center portion may have a greater thickness than the outer metal electrode substrates 50 which are located on the left and the right. As described above, when the optical device substrate is manufactured, the inner metal electrode substrates 47 may be sequentially stacked, or the inner metal electrode substrates 47 having a greater thickness may be applied. This may be done in order to obtain four substrates having 2×2 optical device attachment areas C by cutting along a cutting line F-F' and a cutting line G-G', after manufacturing a substrate having 4×4 optical device attachment areas C as shown in FIG. 8.

That is, the method of manufacturing the substrate according to an embodiment of the present invention may be a method in which the outer metal electrode substrates 50 can be cut to be divided into a plurality of optical device substrates after inserting the metal electrode substrates (that is, inner electrode substrates) having a greater thickness than the outer metal electrode substrates 50 bonded to the top and bottom of the second metal substrate-bonded body into the inner side of the substrate. Further, it may be possible to manufacture a substrate for a plurality of optical devices by bonding each optical device substrate, which is separately manufactured, using an insulating bonding member.

Figure 9:
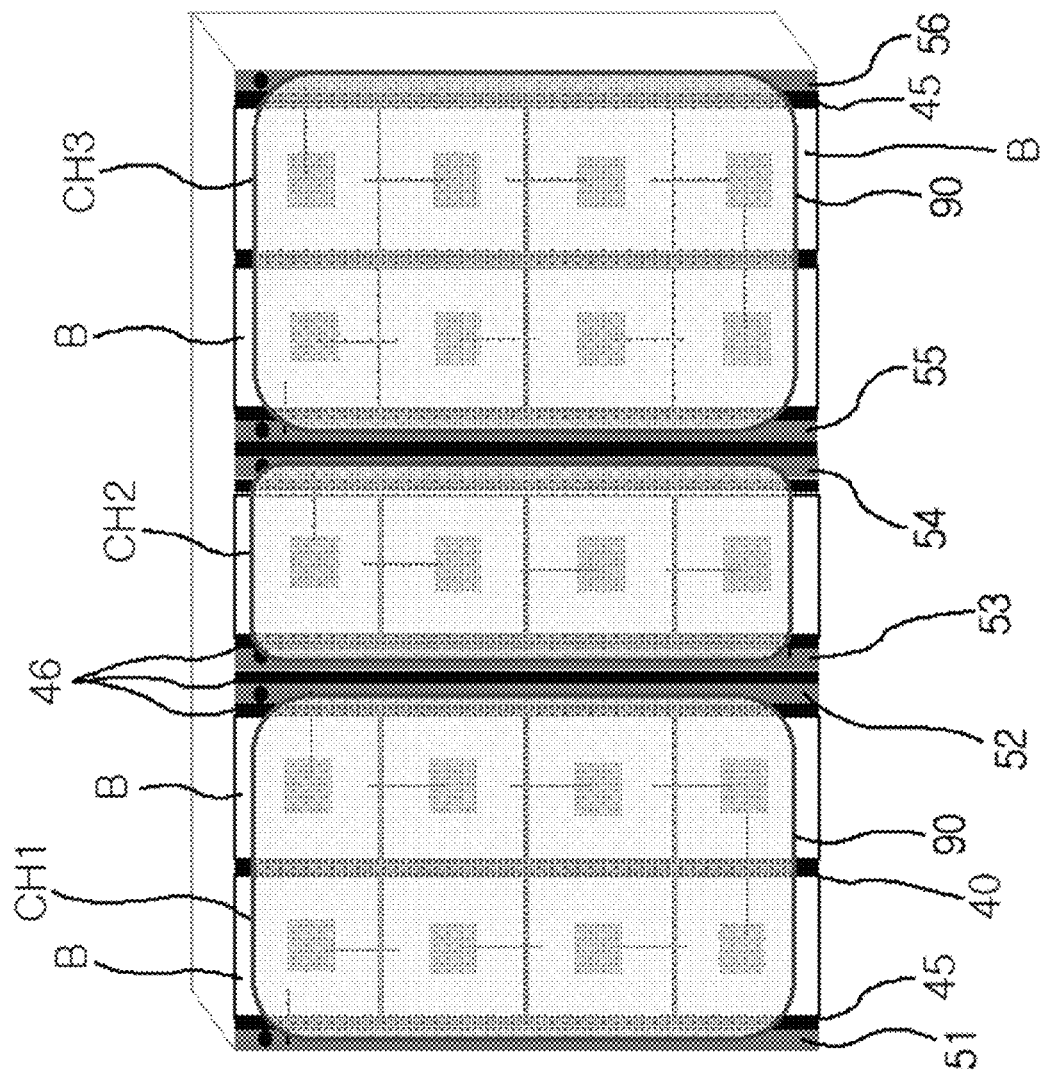
FIG. 9 is a diagram illustrating an optical device substrate according to an embodiment of the present invention for additionally describing the optical device substrate in which different power sources are provided and a circuit of a plurality of channels is constructed.

Finally, FIG. 9 is a diagram illustrating an optical device substrate according to an embodiment of the present invention for additionally describing an optical device substrate in which different power sources are provided and a circuit of a plurality of channels is constructed.

FIG. 9 illustrates an optical device substrate having 4×5 optical device attachment areas C. The optical device substrate may be divided into three channel areas CH1, CH2, and CH3 by the pairs of inner metal electrode substrates 52 to 55 located in the inner side of the substrate, and the cavity 90 of each channel area having a predetermined depth in the optical device substrate and a shape of a wide upper portion and a narrow lower portion may be formed to accommodate the optical device attachment areas constructing each of the divided channel areas CH1, CH2, and CH3 in the bottom surface of the independent cavity 90. Optical devices may be bonded in the bottom surface of the cavity 90 of each channel area when the protective layer is formed after the connection in order to form an electrical path using the wire, and an independent circuit may be constructed even when the optical devices are on one substrate.

For reference, in FIG. 9, when the outer metal electrode substrate 51 and the inner electrode substrate 52 are connected to power terminals, the power may be supplied to the optical devices constructing the channel CH1, and the power may be supplied to the optical devices constructing the channel CH2 using the inner metal electrode substrates 53 and 54. Further, the power may be supplied to the optical devices constructing the channel CH3 using the metal inner electrode substrates 55 and the outer electrode substrate 56. Accordingly, since manufacturing according to the present invention can be performed by inserting a plurality of inner metal substrates 52 to 55 into the inner side of the optical device substrate, independent channels can be formed by grouping the plurality of optical devices by the outer and inner metal electrode substrates 51 to 56, and since independent power for each channel is able to be supplied, each channel can be independently controlled by constructing optical device circuits of the plurality of channels according to a service environment and a use.

For reference, the numeric symbol 45 in FIG. 9, which has not been described, represents a second horizontal insulating member for insulating the outer electrode metal substrates 51 and 56 from the unit block substrate B which is adjacent to the outer electrode metal substrates 51 and 56; and the numeric symbol 40 represents a first horizontal insulating member for insulating between the unit block substrates B being stacked. And, the numeric symbol 46 represents third horizontal insulating members for insulating the both side surfaces of the inner metal electrode substrates 52, 53, 54, and 55 respectively.

Although the present invention is described with reference to embodiments shown in the accompanying drawings, these are only examples, and those skilled in the art should understand that many modifications and other equivalent embodiments are possible. For example, in an embodiment of the present, although a step of forming a plating layer in a bottom surface and a wall of the cavity in order to improve optical reflectivity is not shown, the substrate may be manufactured with this additional operation. Further, the present invention can be applied to an optical device substrate manufactured with an additional operation of forming a plating layer as an electrode layer in a bottom surface of surface mount devices (SMDs) without any modifications. Accordingly, the scope of the present invention should be construed according to the claims.

What is claimed is:

1. An optical device substrate comprising:
 a stack of unit block substrates, each unit block substrate accommodating therein (n−1) number of insulating members, where (n>1), for insulating adjacent partitioned areas of a flat panel metal substrate, the insulating members partitioning the flat panel metal substrate into n number of optical device attachment areas;
 first horizontal insulators for insulating surfaces of each unit block substrate in a horizontal direction from surfaces of adjacent unit block substrates;
 outer metal electrode substrates bonded to the unit block substrates at the top and bottom of the stack, the outer metal electrode substrates supplying power;
 second horizontal insulating members for insulating between the outer metal electrode substrates and the unit block substrates to which the outer metal electrode substrates are bonded;
 a pair of inner metal electrode substrates positioned between two consecutive unit block substrates within the stack; and
 third horizontal insulating members for insulating surfaces of the inner metal electrode substrates from the unit block substrates.

2. The optical device substrate according to claim 1, wherein at least one of the inner metal electrode substrates has a greater thickness than at least one of the outer metal electrode substrates.

3. The optical device substrate according to claim 1, further comprising:
 a cavity having a predetermined depth in at least one of the unit block substrates wherein an upper portion of the cavity is wider than a lower portion of the cavity so that every optical device attachment area is accommodated at a bottom surface of the cavity.

4. The optical device substrate according to claim 3, further comprising:
 optical devices to be attached to at least a portion of the optical device attachment areas in the cavity; and
 wires for electrically connecting the optical devices with the optical device attachment areas or the inner or outer metal electrode substrates adjacent to the optical devices.

5. The optical device substrate according to claim 4, further comprising: a protective layer for protecting at least one optical device attached to the cavity.

\* \* \* \* \*